United States Patent
Lee et al.

(10) Patent No.: US 7,265,045 B2
(45) Date of Patent: Sep. 4, 2007

(54) METHOD FOR FABRICATING THERMAL COMPLIANT SEMICONDUCTOR CHIP WIRING STRUCTURE FOR CHIP SCALE PACKAGING

(75) Inventors: Jin-Yuan Lee, Hsin-Chu (TW); Eric Lin, Hsin-Chu (TW)

(73) Assignee: Megica Corporation, Hsin-Chu (TW)

( * ) Notice: Subject to any disclaimer, the term of this patent is extended or adjusted under 35 U.S.C. 154(b) by 0 days.

(21) Appl. No.: 10/925,302

(22) Filed: Aug. 24, 2004

(65) Prior Publication Data

US 2005/0020052 A1      Jan. 27, 2005

Related U.S. Application Data

(63) Continuation-in-part of application No. 10/279,267, filed on Oct. 24, 2002, now Pat. No. 6,806,570.

(51) Int. Cl.
*H01L 21/44* (2006.01)
(52) U.S. Cl. .................................... 438/613
(58) Field of Classification Search ................ 257/522, 257/737, 738, 778, 784; 438/613
See application file for complete search history.

(56) References Cited

U.S. PATENT DOCUMENTS

| | | | | |
|---|---|---|---|---|
| 3,171,796 A | * | 3/1965 | Stephens et al. | 205/125 |
| 4,857,481 A | * | 8/1989 | Tam et al. | 438/619 |
| 6,028,364 A | | 2/2000 | Ogino et al. | 257/778 |
| 6,197,613 B1 | * | 3/2001 | Kung et al. | 438/106 |
| 6,395,581 B1 | | 5/2002 | Choi | 438/108 |
| 6,423,571 B2 | | 7/2002 | Ogino et al. | 438/106 |
| 6,521,970 B1 | * | 2/2003 | Takiar et al. | 257/522 |

\* cited by examiner

*Primary Examiner*—Roy Potter
(74) *Attorney, Agent, or Firm*—Saile Ackerman LLC; Stephen B. Ackerman; Rosemary L. S. Pike

(57) ABSTRACT

A new method to form an integrated circuit device is achieved. The method comprises providing a substrate. A sacrificial layer is formed overlying the substrate. The sacrificial layer is patterned to form temporary vertical spacers where conductive bonding locations are planned. A conductive layer is deposited overlying the temporary vertical spacers and the substrate. The conductive layer is patterned to form conductive bonding locations overlying the temporary vertical spacers. The temporary vertical spacers are etched away to create voids underlying the conductive bonding locations.

42 Claims, 7 Drawing Sheets

METHOD FOR FABRICATING THERMAL COMPLIANT SEMICONDUCTOR CHIP WIRING STRUCTURE FOR CHIP SCALE PACKAGING

This Patent Application is a Continuation-in-Part of U.S. patent application Ser. No. 10/279,267, filed on Oct. 24, 2002 now U.S. Pat. No. 6,806,570.

BACKGROUND OF THE INVENTION (1) Field of the Invention

The present invention relates, in general, to the integrity and reliability of semiconductor chip interconnections and, more specifically, to the methods of fabricating multi-layer wiring structures on semiconductor chips for relieving thermal stresses on solder ball interconnections.

(2) Description of the Prior Art

The advent of VLSI technology in the semiconductor field has resulted in the demand for high density packaging. Semiconductor packaging traditionally has three levels of package. In the first level, a single chip module comprises a semiconductor chip attached to a substrate that includes interconnections to the next level of package. The substrate and chip assembly is usually molded in an encapsulant for environmental protection. In the second level of packaging, a printed circuit card typically mounts to the single chip modules. Finally, the third level package is usually a planar printed circuit board.

The utilization of VLSI semiconductor chips in commercial electronic products such as cameras, camcorders, DVD players, etc., requires that semiconductor packages be highly reliable and space efficient in their designs. In addition, military applications require lightweight, space efficient, highly reliable packaging structures. Elimination of a level of packaging has been a driving force in electronic system design in the recent past. This reduction would allow for closer spacing of semiconductor chips and also reduce signal delays. In addition, the reduction of a level of packaging would increase product reliability and decrease product costs. One design currently in use is direct chip attach. In this design, integrated circuits are flip chip mounted onto a substrate, usually ceramic, and then the assembly is sealed in an enclosure for environmental protection. The environmental protection is required to protect the semiconductor and the interconnections against corrosive elements and mechanical disturbances. Unfortunately, the inclusion of enclosures for environmental protection results in larger packages with longer distances between semiconductor chips. This also creates longer signal delays.

In addition, advances in VLSI technology in the semiconductor field have created the need for higher interconnection density on the surface of the semiconductor chip. Such interconnections are used to connect between chip terminals and the next level of packaging or to a printed circuit board. The requirement for higher density interconnections is created by the advent of smaller circuit devices fabricated in recent manufacturing processes. These smaller circuits, in turn, result in higher circuit counts per chip. These higher circuit counts further require the addition of signal input and output connections. In addition, the higher circuit counts increase the power requirements and connectivity of the chips. This need for higher interconnection density has resulted in interconnection techniques such as the use of solder bumps. Solder bump interconnect systems utilize the total area overlying the chip and thus providing more interconnections per chip.

One significant challenge that must be overcome when using solder bumps is the issue of thermally induced mechanical stress. These mechanical stresses in the solder bump result from differences in the thermal coefficient of expansion (TCE) of the basic materials used, such as between the silicon substrate, the metal interconnects, and the solder bumps. In an application where the product utilizes a silicon semiconductor chip and the next level of package is an epoxy—glass printed circuit card and the product usage is in a home or office environment—the resultant thermally induced strains are such that the solder of the solder bumps is stressed beyond the elastic limit of the material. Solder fatigue cracks develop due to the ON—OFF thermal cycling that occurs during normal product usage. These fatigue cracks eventually result in faulty interconnections and, therefore, represent a serious reliability concern.

In order to minimize the thermal stresses on the solder ball interconnections a method currently in use is shown, in cross section, in FIG. 1. The semiconductor chip 10 has an interconnecting wiring structure 12 fabricated by conventional photolithography. The wiring structure 12 is composed of copper Cu or aluminum Al metallurgy with polyimide for the insulator. Polyimide is known to have a low coefficient of thermal expansion. A buffer layer 14 is added to the above structure by soldering or by pressure metal bonding the interconnections. Solder balls 16 are added by plating or evaporation. The buffer layer 14 comprises a low modulus elastomer with thru metal vias for interconnections. The buffer layer 14 provides stress relief that is required when the chip scale package is interconnected to the next level package. If this method is used to directly mounted chip scale packaging onto printed circuit boards, then additional processes are required to add the buffer layer. In addition, electrical delay is increased in the final circuit.

A drawback to the chip scale packaging design is that the basic materials used, silicon for the semiconductor chip, and glass-epoxy for the printed circuit cards and boards, have different thermal coefficients of expansion TCE. The TCE for silicon based materials ranges from 2.5–3.5 ppm/0C whereas the TCE for glass-epoxy structures is in the range of 15–25 ppm/0C. This difference in TCE results in thermally induced stresses in the solder ball interconnections when the product is in use. The stresses in the solder ball interconnections are due to the thermally induced strains when the product is thermally cycled during use.

Several prior art inventions relate to the design of semiconductor devices with thermal stress relief. U.S. Pat. No. 6,028,364 to Ogino et al describes a design utilizing an elastomer for thermal stress relief on a bumped semiconductor chip. U.S. Pat. No. 6,395,581 to Choi describes a method for fabricating a BGA semiconductor package utilizing a metal powder as a flexible member for improved solder joint reliability. U.S. Pat. No. 6,423,571 to Ogino et al provides a method for making semiconductor solder bumped chip structures utilizing an elastomer for the dielectric material as a stress relieving mechanism.

SUMMARY OF THE INVENTION

Accordingly it is an object of the present invention to provide methods for fabricating multi-layer wiring structures on a semiconductor chip such that thermally induced mechanical stresses at the solder ball terminals are reduced or eliminated.

It is a further object of the present invention is to provide a product with reduced thermal stresses such that a chip scale package can be directly mounted onto a printed circuit interconnect.

Another object of the present invention is to provide methods of fabrication utilizing materials and fabrication processes currently used in semiconductor manufacture.

It is a further object of the present invention is to provide a product fabricated by the described methods and having a thermally compliant multi-layered wiring structure that can be used in high thermal cycled products with resultant high reliability.

In accordance with the objects of this invention, a method to form an integrated circuit device is achieved. The method comprises providing a substrate. A sacrificial layer is formed overlying the substrate. The sacrificial layer is patterned to form temporary vertical spacers where conductive bonding locations are planned. A conductive layer is deposited overlying the temporary vertical spacers and the substrate. The conductive layer is patterned to form conductive bonding locations overlying the temporary vertical spacers. The temporary vertical spacers are etched away to create voids underlying the conductive bonding locations.

Also in accordance with the objects of this invention, an integrated circuit device is achieved. The device comprises a substrate and a conductive layer overlying the substrate with voids therebetween at conductive bonding locations. The conductive layer comprises a metal layer overlying a barrier layer. The metal layer further overlies and contacts metal pads such that electrical contacts to the conductive bonding locations create electrical connections to the metal pads.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form an interconnecting structure for bonding solder bumps onto an integrated circuit device. A novel void structure is formed to improve the thermal performance of the solder bonded device. The strain on the interconnecting solder bump or ball is reduced or eliminated by the embodiments of the present invention. This improvement is accomplished by the design of the multi-layer wiring structure on the semiconductor chip in a manner that does not allow the thermally induced strain to be transmitted to the interconnecting solder ball. The multi-layer wiring structure incorporates a void or gap under the metal interconnection wiring. This design provides an elastic structure that is ductile by design so that it will not transmit the thermally induced strain from the substrate to the interconnecting solder balls. It should be clear to those experienced in the art that the present invention can be applied and extended without deviating from the scope of the present invention.

Figure 1:
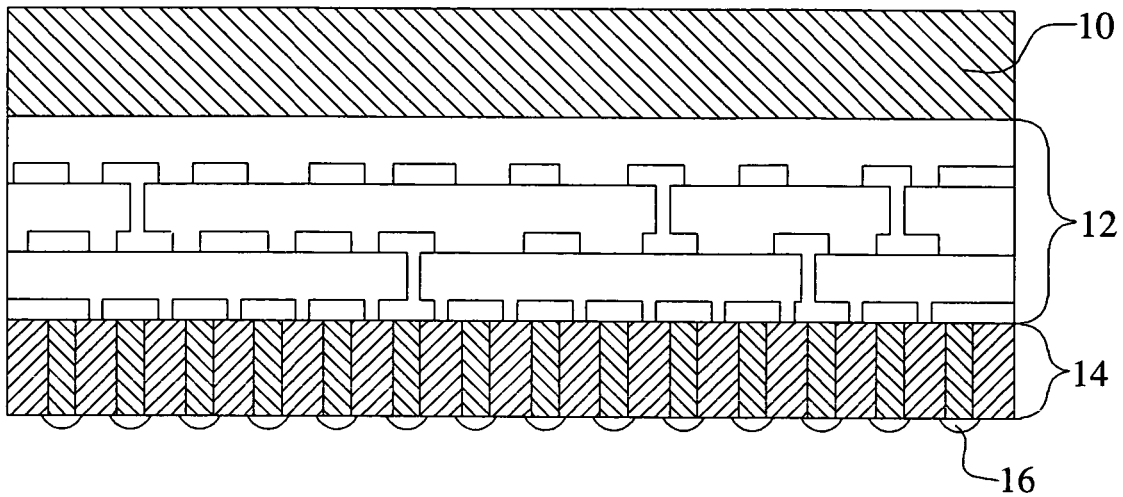
FIG. 1 illustrate a prior art interconnect method for an integrated circuit.
Figure 2:
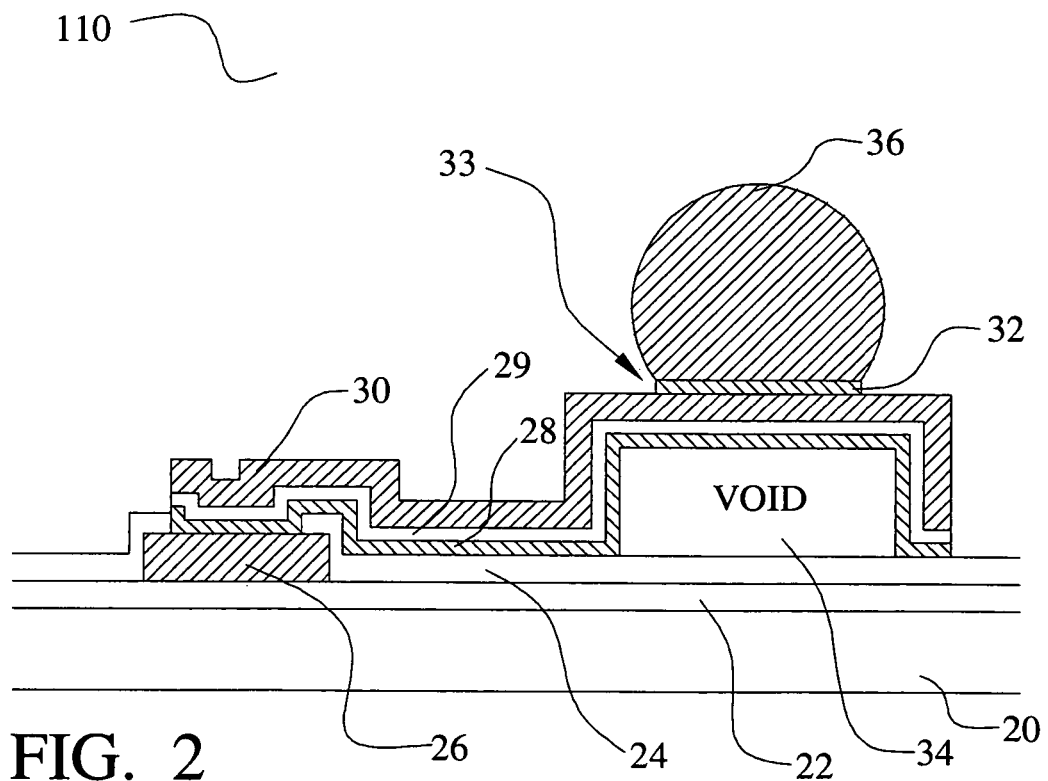
FIG. 2 illustrates a first preferred embodiment of the present invention in cross sectional representation.

Referring now to FIG. 2, a first preferred embodiment 110 of the present invention is illustrated. Several important features of the present invention are shown and discussed below. In FIG. 2, a partial cross section of an integrated circuit device 110, formed according to the first preferred embodiment, is shown. The device 110 comprises a substrate 20. The substrate 20 preferably comprises a semiconductor material and, more preferably, comprises monocrystalline silicon as is well known in the art. However, the composition of the substrate 20 is not of primary importance to the present invention. A dielectric layer 22 is shown formed overlying the substrate 20. In practice, a plurality of devices, such as transistors, capacitors, resistors, and interconnecting structures, may be formed in or on the substrate 20 and the dielectric layer 22. Further, the dielectric layer 22 may further comprises a plurality of levels and materials, including multiple levels of interconnecting films. For simplicity of illustration, however, the substrate 20 and the dielectric layer 22 are shown as single layers.

A metal pad 26 is formed overlying the dielectric layer 22. In practice, a plurality of metal pads 26 are formed at the topmost layer of the integrated circuit device 110. These metal pads 26 provide a means to mechanically and electrically connect the device 110 to a package or to a circuit board as is well known in the art. Further, in the art, metal bumps may be directly attached to metal pads 26 of the present invention in the formation of flip-chip devices. While not shown in the illustration, the metal pads 26 are preferably connected to an underlying metal layer and, ultimately, to devices and structures in the dielectric layer 22 and in the substrate 20 of the device 110. A passivation layer 24 is formed overlying the dielectric layer 22 and metal pads 26. The passivation layer 24 preferable comprises a dielectric film and, more preferably, comprises a silicon nitride layer as is well known in the art.

As important further features of the device 110 of the first embodiment of the present invention, a conductive layer 28, 29, and 30 overlies the passivation layer 24. Further, the conductive layer 28, 29, and 30 overlies a void 34 at each conductive bonding location 33. Finally, the metal layer 28, 29, and 30 overlies and contacts the metal pads 26 such that electrical contacts to the conductive bonding locations 33 create electrical connections to the metal pads 26.

The conductive layer 28, 29, and 30 may comprise a single metal film. However, in the preferred embodiment, the conductive layer 28, 29, and 30 comprises a metal layer 30 overlying a barrier layer 28 with a seed layer 29 therebetween. The barrier layer 28 acts as a glue or adhesion layer to create excellent adhesion between the overlying metal layer 30 and the metal pad 26 and the passivation layer 24. In addition, the barrier layer 28 may prevent metal ion diffusion between the metal layer 30 and the metal pad 26. The barrier layer 28 is not an essential feature of the present invention. However, depending upon the composition of the metal pad 26 and of the metal layer 30, the barrier layer 28 may be required. As another feature of the preferred embodiment, a seed layer 29 is formed overlying the barrier layer 28. The seed layer 29 may be required as a reaction catalyst or precursor if the metal layer 30 is deposited by electroplating or electroless plating. In the preferred embodiment, a seed layer 29 is used and this seed layer 29 comprises Au, Cu, or a Ni-alloy. The metal layer 30 preferably comprises Ni, Ni-alloy, Cu overlying Ni, or Ni overlying Au.

Each conductive bonding location 33 comprises an area of the conductive layer 28, 29, and 30 where a connection, in this case a solder bump 36, is made. As an optional feature, a metal wetting layer 32 overlies the conductive layer 28, 29, and 30 to facilitate excellent bonding of the solder bump 36 to the device 110. The metal wetting layer 32, if used, preferably comprises Au, Cu, Sn, Ag, Pb, or an alloy of any of these metals. A solder bump 36 overlies the metal wetting layer 32. The solder bump 36 may comprise Pb or an alloy of Pb as is well known in the art.

The key feature of the device 110 of the present invention is the relatively thin conductive layer 28, 29, and 30 overlying the void 34. A bridge structure, or cushion structure, has been created. As described above, thermal cycling will cause thermal expansion or contraction of the substrate 20. As a result, the substrate 20 may move laterally (up/down). In the present invention, the bump 36 is effectively suspended over the substrate 20 by the bridge structure. Therefore, elastic deformation of the substrate 20, induced by thermal expansion, can be accommodated by the design. If there is a lateral shift in the substrate 20, then the flexible conductive layer 28, 29, and 30 will be able to deform slightly to accommodate the shift. In this way, the solder ball 36 can be firmly seated onto the pad 32 and will remain firmly attached even under large thermal cycling. The resulting structure may be termed "thermally compliant" meaning, simply, that the structure is able to accommodate the strain induced by the thermal expansion of the silicon substrate 20. Alternatively, the structure may be termed strain compliant.

Figure 3:
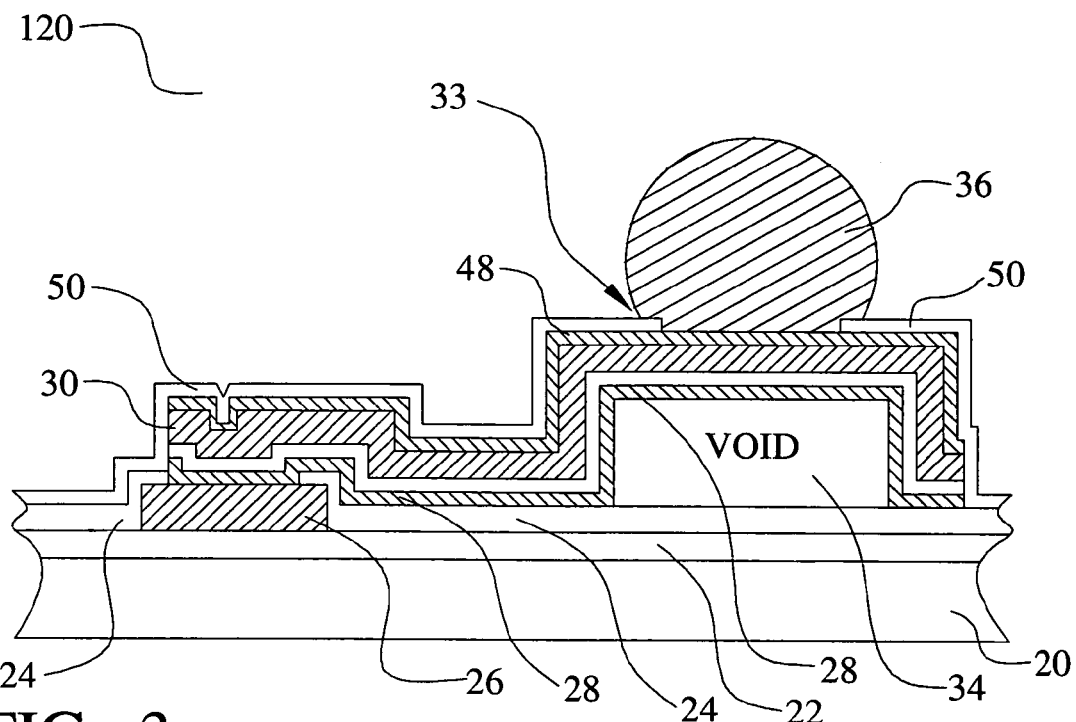
FIG. 3 illustrates a second preferred embodiment of the present invention in cross sectional representation.

Referring now to FIG. 3, a second preferred embodiment 120 of the present invention is illustrated. Several important features of the present invention are shown and discussed below. The second preferred embodiment 120 differs from the first preferred embodiment 110 in two key respects. First, the metal wetting layer 48 of the second embodiment 120 extends across the entire conductive layer 28, 29, and 30. By comparison, the metal wetting layer 32 of the first embodiment 110, as shown in FIG. 2, is only formed at the conductive bonding locations 33. In the first embodiment 110, the metal wetting layer 32 defines where the solder bump 36 will be formed due to the wetting or adhesion properties between the wetting layer 32 and the bump 36. Referring again to FIG. 3, in the second embodiment, the solder bump 36 area is defined by the opening in a post passivation dielectric layer 50 that overlies the metal wetting layer 48. The metal wetting layer 48 again preferably comprises Au, Cu, Sn, Ag, Pb, or an alloy of any of these metals. The post passivation, or over coating, layer 50 comprises a dielectric layer. More preferably, polyimide or BCB is used for the post passivation layer 50. The polyimide layer 50 may be photosensitive or non-photosensitive. The other key features, especially the relatively thin conductive layer 28, 29, 30, and 48 overlying the void 34, are essentially the same as in the first embodiment 110.

Figure 14:
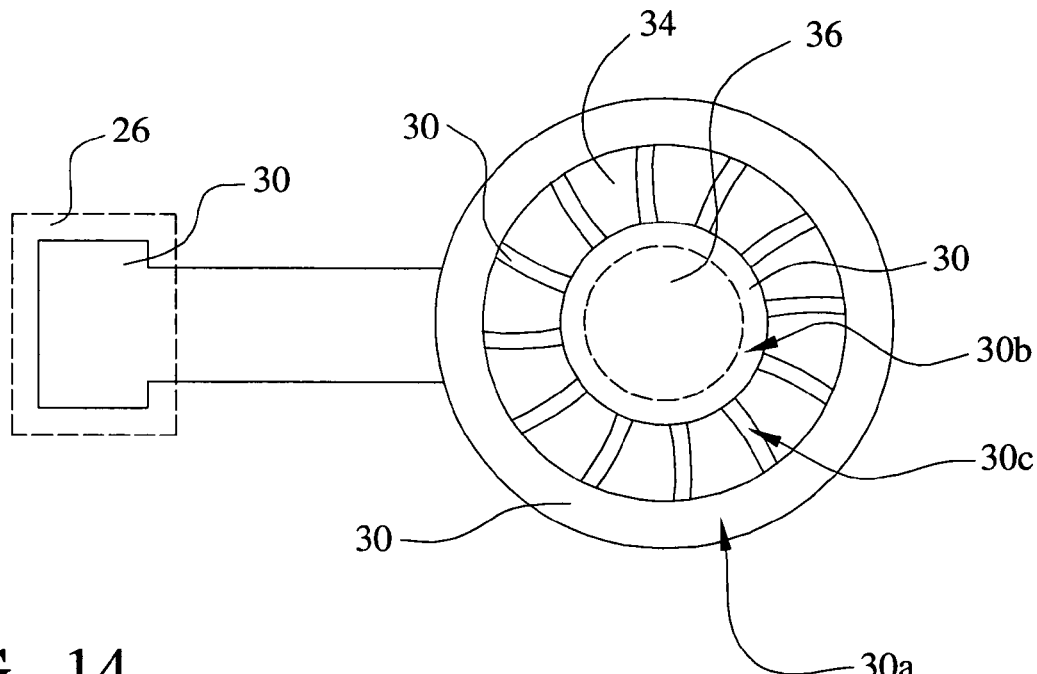
FIG. 14 illustrates a third preferred embodiment of the present invention showing a perforated structure in top view.

Referring now to FIG. 14, a third preferred embodiment 150 of the present invention is illustrated. In this case, a top view is shown of a particular form of the interconnection structure or device 150. The conductive layer 30 is shown. A physical contact is made to the metal pad 26 at the left. A solder bump 36 is formed at the right. The conductive layer 30 connects the metal bump 26 to the solder bump 36. As an important feature, the conductive layer 30 at the solder bump 36 takes on a particular cushion structure called a perforated structure. In particular, the conductive bonding location 30b of the conductive layer 30 is surrounded by an outer ring 30a of the conductive layer 30. Further, lines 30c of the conductive layer 30 connect the conductive bonding location 30b to the ring 30a surrounding the conductive bonding location 30b. The lines 30c, or straps, are preferably further arc-shaped. Note that conductive bonding location 30b and the straps 30c are formed overlying the void area 34. This construction, where the solder bump 36 is bonded to the conductive layer 30 in bonding location 30b that is further suspended over a void by metal straps 30c, provides excellent isolation of the bump 36 from thermal deformations of the substrate. This structure 150 allows the metal layer 30 to bend at a large percentage of deformation and, further, allows this deformation in all directions. By comparison, a simple geometry, such as a metal plank constructed in the conductive layer 30, would not deform at as large a percentage and would exhibit poorer deformation response in certain directions based on the geometric orientation of the plank.

Figure 4:
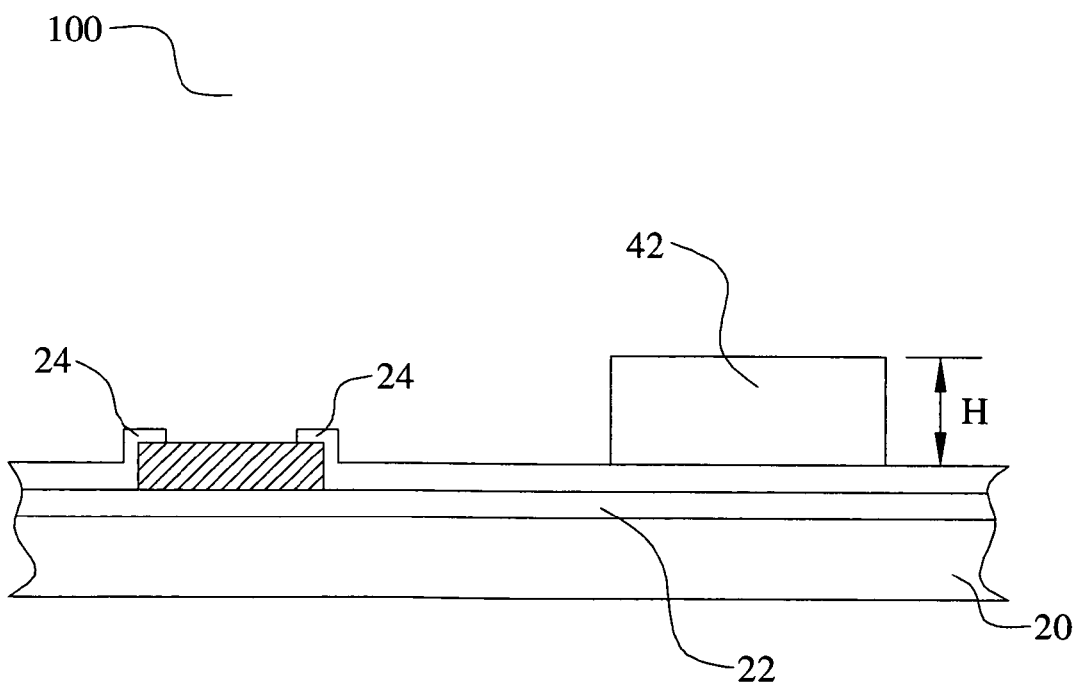
FIGS. 4 through 6 illustrate steps common to the first and second preferred embodiments of the present invention.
Figure 5:
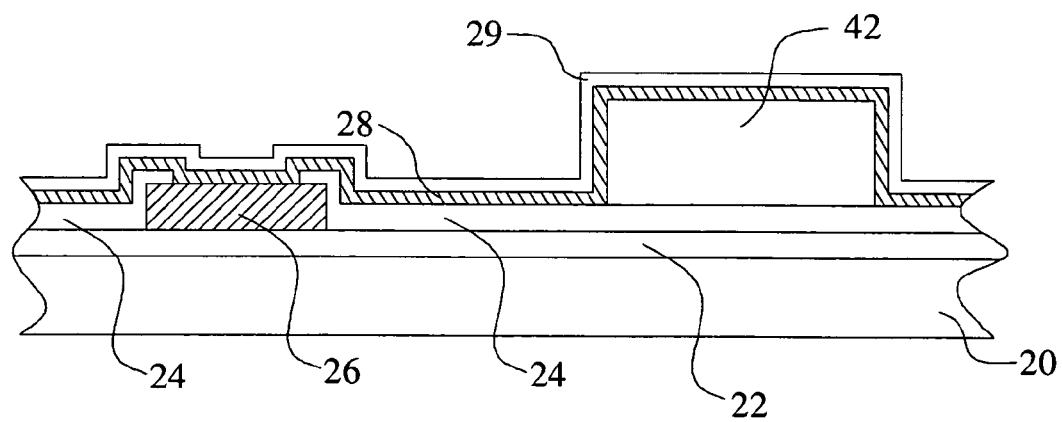
Figure 6:
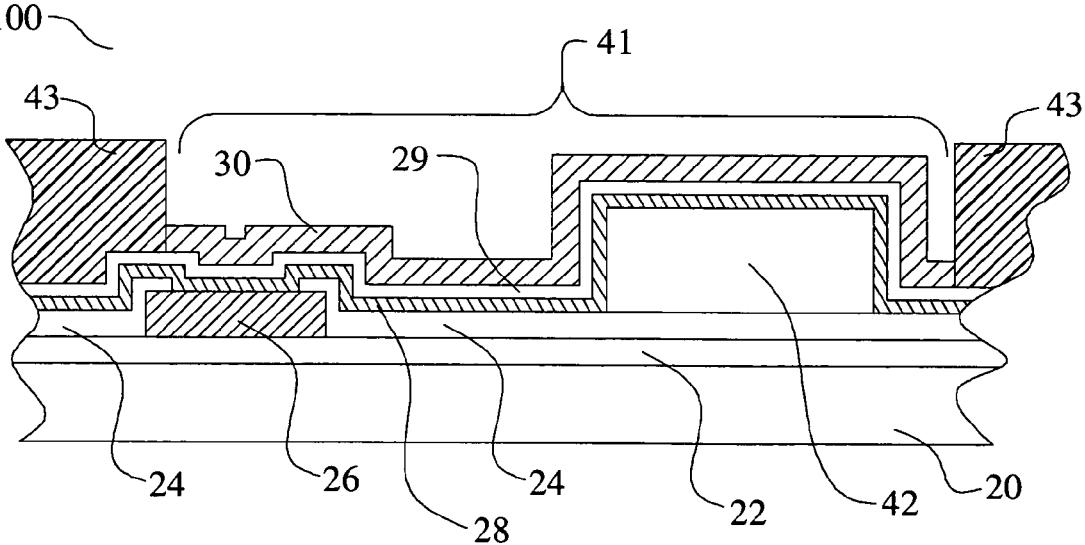
Figure 7:
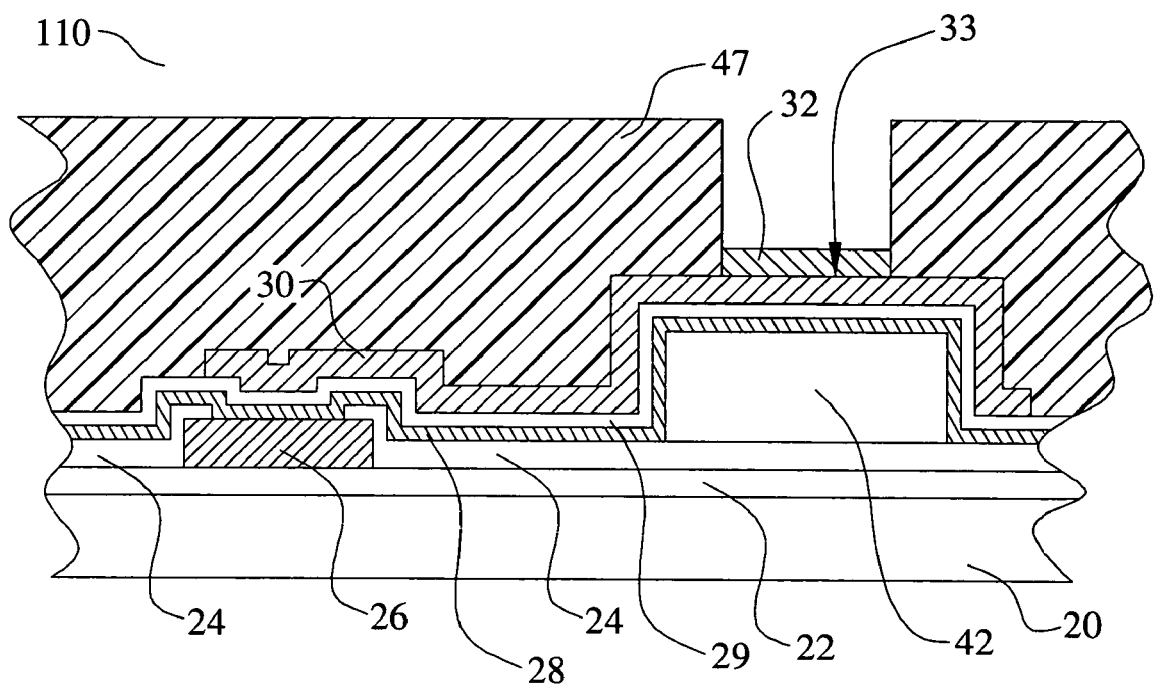
FIGS. 7 through 9 illustrate steps unique to the first preferred embodiment of the present invention.
Figure 8:
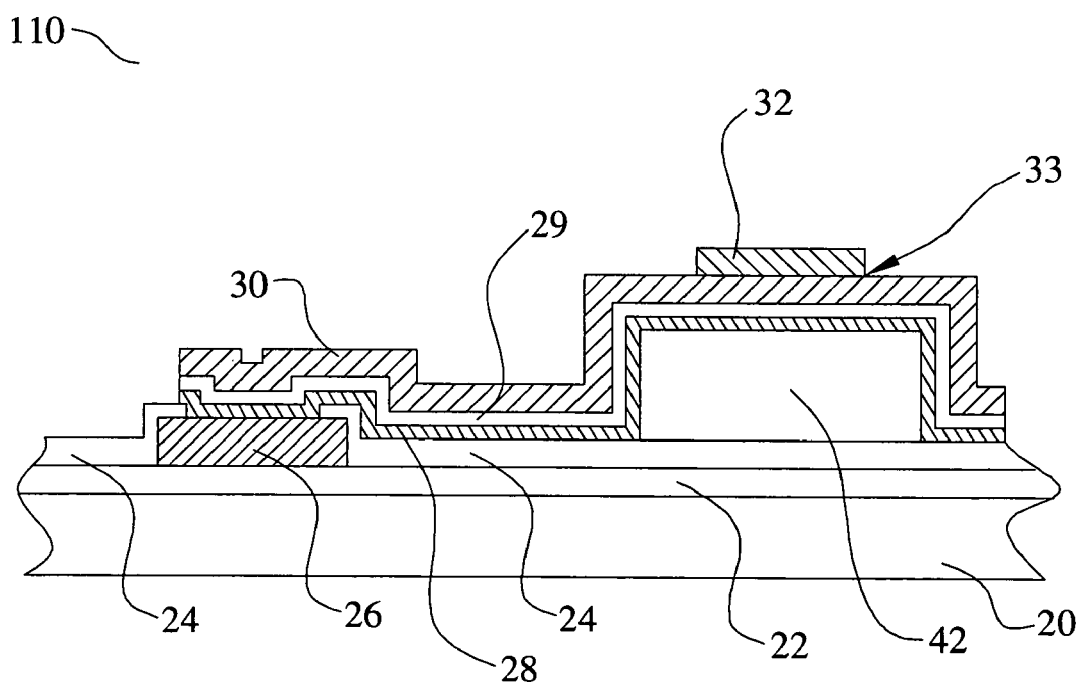
Figure 9:
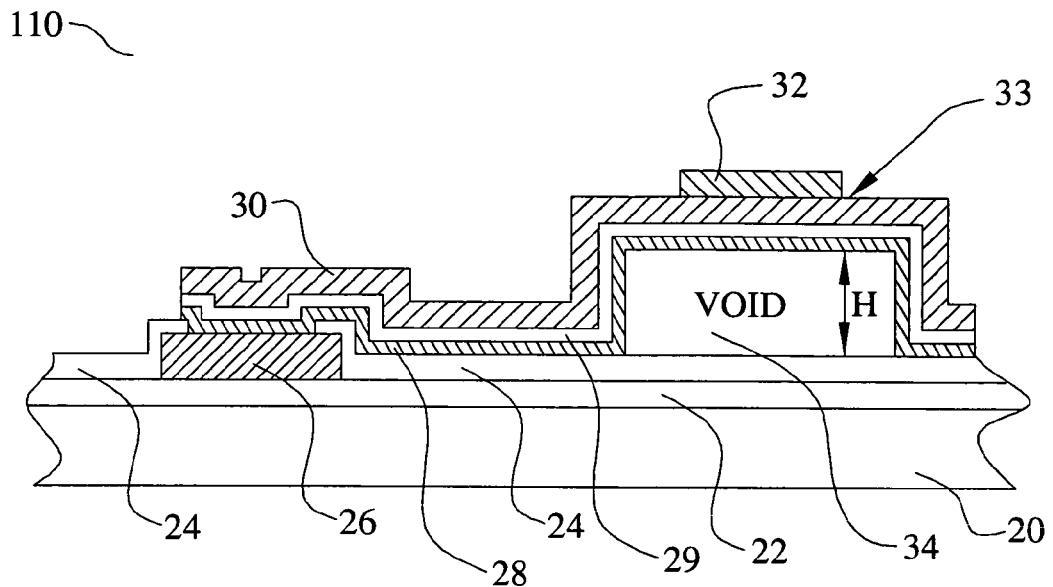

Referring now to FIGS. 4 through 6, 7 through 9, and 10 through 13, methods to form the first and second preferred embodiments of the present invention are illustrated. More particularly, FIGS. 4 through 6 illustrated preliminary steps in the method of formation that are common to both the first embodiment device 110 and the second embodiment device 120. FIGS. 7 through 9 show additional steps in the method of formation that are unique to the first embodiment 110, while FIGS. 10 through 13 show additional steps in the method of formation that are unique to the second embodiment 120. Referring again to FIG. 4, the preliminary device 100 is shown in cross sectional representation. A substrate 20 is provided. The substrate 20 preferably comprises a semiconductor material and, more preferably, comprises monocrystalline silicon as is well known in the art. However, the composition of the substrate 20 is not of primary importance to the present invention. A dielectric layer 22 is shown formed overlying the substrate 20. In practice, a plurality of devices, such as transistors, capacitors, resistors, and interconnecting structures may be formed in or on the substrate 20 and the dielectric layer 22. Further, the dielectric layer 22 may further comprises a plurality of levels and materials, including multiple levels of interconnecting films. For simplicity of illustration, however, the substrate 20 and the dielectric layer 22 are shown as single layers.

A metal pad 26 is formed overlying the dielectric layer 22. In practice, a plurality of metal pads 26 are formed at the topmost layer of the integrated circuit device 110. These metal pads 26 provide a means to mechanically and electrically connect the device 110 to a package or to a circuit board as is well known in the art. While not shown in the illustration, the metal pads 26 are preferably connected to an underlying metal layer and, ultimately, to devices and structures in the dielectric layer 22 and the substrate 20 in device 110 of the present invention. The metal pads 26 are preferably formed by first depositing a metal layer 26, such as aluminum, copper, or an alloy of aluminum and/or copper, overlying the dielectric layer 22. The metal layer 26 may be deposited by any of the known methods such as sputtering, evaporation, or plating. The metal layer 26 is then preferably patterned using a photolithography and etching sequence. For example, a photoresist layer, not shown, is first deposited overlying the metal layer 26. The photoresist layer is next exposed to actinic light through a patterned mask and then developed. As a result, the patterned from the mask is transferred to the photoresist layer, as either a positive or a negative image, such that the photoresist layer covers the metal layer 26 where the metal pads 26 are planned. An etching process is then performed to remove the metal layer 26 that is exposed by the photoresist so that only the desired metal features, such as the metal pads 26, remain. Finally, the photoresist layer is stripped away.

A passivation layer 24 is next formed overlying the dielectric layer 22 and metal pads 26. The passivation layer 24 preferable comprises a dielectric film and, more preferably, comprises a silicon nitride layer as is well known in the art. For example, a low-pressure, chemical vapor deposition (LP-CVD) process may be used to deposit the passivation nitride layer 26 overlying the dielectric layer 22 and the metal pads 26. The passivation layer 24 is then patterned to form pad openings that reveal the top surface of the metal pads 26 as shown. This patterning step may be performed using, for example, a photolithography and etching sequence as described above.

Next, as an important feature of the present invention, temporary vertical spacers 42 are formed overlying the passivation layer 24. The temporary vertical spacers 42 are used to create the voided areas 34 underlying the novel conductive bridge structures 28, 29, and 30 of the present invention as shown by FIGS. 2 and 3. Referring again to FIG. 4, the temporary vertical spacers 42 comprise a material that can be easily and completely removed after the conductive layers are formed overlying the spacers 42. To facilitate ease of removal, the temporary vertical spacers 42 should comprise a material that can be selectively etched with respect to the conductive layers that will subsequently overlie the spacers 42 and with respect to the passivation layer 24 that underlies the spacers 42. To this end, it is found that various photoresist and polymer materials are ideally suited to this function. In particular, dry film resist, polyimide, and high-temperature capable photoresist are preferred for the spacers 42.

In the preferred method of formation, a sacrificial layer 42 comprising one of the photoresist or polymer materials is deposited overlying the passivation layer 24 and the metal pads 26. The deposition method may be by spin coating, lamination, or by screen printing. Next, the sacrificial layer 42 is patterned to form the temporary vertical spacers 42. The patterning may be performed in one of several ways depending on the composition of the sacrificial layer 42. First, if the sacrificial layer 42 comprises a photoresist film, then a photolithography process is used to pattern the photoresist 42. That is, the sacrificial layer 42 is exposed to actinic light through a mask bearing the pattern for the planned temporary vertical spacers 42. After development, only the temporary vertical spacers 42 remain. This is the preferred method of formation since no explicit etching steps are required. Second, if the sacrificial layer 42 comprises a non-photoresist layer, then the patterning process would comprise depositing and patterning an overlying photoresist layer, not shown, using this photoresist layer to mask an etching process to define the final temporary vertical spacers 42, and then stripping away the photoresist layer. Third, if screen printing is used to deposit the sacrificial layer 42, then this process can also define the temporary vertical spacers 42 at the same time. In screen printing, a patterned screen is placed over the receiving surface that is, in this case, the substrate. Liquid material is applied onto the screen, is forced by mechanical pressure through openings in the screen, and is thereby transferred onto the receiving surface as a negative image of the screen. If screen printing is used, then the sacrificial layer 42 is directly applied to the passivation layer 24 to form the temporary vertical spacers 42 without further patterning.

Note that the temporary vertical spacers 42 do not overlie the metal pads 26. Rather, the temporary vertical spacers 42 are preferably placed near the metal pads 26 such that the subsequently formed conductive layer will both connect to the metal pads 26 and will bridge over the temporary vertical spacers 42. As an additional consideration, the height H of the temporary vertical spacers 42 is important. The sacrificial layer 42 is applied using a process wherein the thickness or height of the layer can by carefully controlled. When the temporary vertical spacers 42 are removed, this thickness H will define the distance between the top of the passivation layer 24 and the bottom of the conductive layers of the bridge structure. In turn, this dimension H largely determines the degree to which the structure can deflect, in response to thermal changes, while reducing the stress induced on the solder bump joints.

Referring now to FIG. 5, a barrier layer 28 and a seed layer 29 are deposited overlying the passivation layer 24, the metal pads 26, and the temporary vertical spacers 42. The barrier layer 28 is used to improve between the metal pads 26 and the subsequently formed metal layer that will connect the pads 26 to the solder bumps. In addition, the barrier layer 28 prevents diffusion of the metal layer into the underlying passivation layer 24. The barrier layer 28 preferably comprises Ti, TiW, TiN, Cr, or composites of these materials. The barrier layer 28 may be deposited using sputter or evaporation. The seed layer 29 is used if the subsequently formed metal layer is deposited by a technique, such as electroless plating or electroplating, that requires a starting layer to catalyze the plating reaction or to improve the orientation of the deposited layer. The seed layer 29, if used, preferably comprises Au, Cu, or a Ni-alloy, depending on the type of metal layer that will be formed. The seed layer 29 may also be deposited by sputter or by evaporation.

Referring now to FIG. 6, another important feature of the present invention is illustrated. The metal layer 30 is formed overlying the barrier and seed layers 28 and 29. The combined metal layer 30, seed layer 2.9, and barrier layer 28 is herein called the conductive layer 28, 29, and 30. The metal layer 30 is preferably formed using a selective deposition of a metal film 30. First, a first masking layer 43 is formed overlying the seed layer 29. The first masking layer 43 preferably comprises a photoresist film 43 that is deposited and patterned using a photolithographic method. Alternatively, a non-photosensitive film may be used for the first masking layer 43 and may be deposited and patterned using a screen printing method as described above. The resulting first masking layer 43 reveals the top surface of the seed layer 29 overlying the areas 41 where the metal layer 30 is planned. In particular, the metal layer 30 is planned overlying the metal pads 26, the temporary vertical spacer 42, and the areas lying therebetween.

The metal layer 30 may comprise Ni, Ni-alloy, a stack of Ni over Cu, or a stack of Au over Ni. The metal layer 30 is preferably formed using either electroless plating or electroplating. The deposited metal layer 30 only forms where the seed layer 29 is exposed by the first masking layer 43. This metal layer 30 thickness is carefully controlled for several reasons. First, a thick metal layer 30 will reduce the resistance of the conductor between the metal pad 26 and the solder bump. However, if the metal layer 30 is too thick, then the bridge structure may not bend or deflect adequately under thermal stress such to prevent the stress or strain due to the thermal load of the substrate from reaching the solder bump interface. Conversely, a too thin metal layer 30 could create a high resistance between the metal pad 26 and the solder bump 36 and might fracture under mechanical or thermal stress. Therefore, the process control should maintain the metal layer thickness 30 between minimum and maximum specifications. At this point, the preliminary steps in the method of formation are complete.

Referring now to FIG. 7, the method of formation unique to the first preferred embodiment 110 of the present invention begins. The first masking layer 43 is removed. A second masking layer 47 is then formed. The second masking layer 47 is used to define areas where a metal wetting layer 32 is formed overlying the conductive layer 28, 29, and 30 at the planned conductive bonding locations 33. The second masking layer 47 preferably comprises a polyimide or other polymer that is deposited and patterned using a photolithographic method. Alternatively, a non-photosensitive film may be used for the second masking layer 47 and may be deposited and patterned using a screen printing method as described above.

The metal wetting layer 32 is deposited overlying the metal layer 30 where the metal layer 30 is exposed by the second masking layer 47. The metal wetting layer 32 is used to provide an interface region between the metal layer 30, which comprises, for example, Cu, Au, or Ni, and the subsequently formed solder bump, which comprises a lead-based or non-lead based solder as is known in the art. The metal wetting layer 32 improves the adhesion of the solder bump while reducing the resistance at the interface between the solder bump and the metal layer 30. The metal wetting layer 32 also defines the bonding width of the subsequently placed solder bumps. The metal wetting layer 32 preferably comprises Au, Cu, Sn, Ag, Pb or alloys of Au, Cu, Sn, Ag, or Pb. The metal wetting layer 32 is preferably deposited using an electroless plating or electroplating process.

Referring now to FIG. 8, the second masking layer 47 is removed. Next, the barrier and seed layers 28 and 29 are etched through to complete the patterning of the conductive layer 28, 29, and 30. The metal layer 30 is used as the masking layer for the etching through of the barrier and seed layers 28 and 29. The barrier and seed layers 28 and 29 may be etched using dry or wet chemical methods as are well known in the art.

Referring now to FIG. 9, as an important step in the method, the temporary vertical spacers 42 are removed to create voids 34 underlying the conductive layer 28, 29, and 30. The temporary vertical spacers 42 are removed using an isotropic etching method that is selective to the sacrificial layer 42. As a result, the conductive layer 28, 29, and 30 becomes a bridge overlying the passivation layer 24 with a void or gap therebetween. The void has a height H that is defined by the original thickness of the sacrificial layer 42 that is now displaced. In one preferred embodiment, the sacrificial layer 42 is etched away using a wet chemical etch. The wet etch removes the sacrificial layer 42 while leaving the conductive layer 28, 29, and 30, the metal wetting layer 32, and the passivation layer 24. To achieve this, the wet etch must exhibit a slow etching rate for the passivation layer 24, preferably nitride, and the conductive layer 28, 29, and 30, preferably metals, and a rapid etching rate for the sacrificial layer 42, typically a photoresist or a polymer. Further, the etch must be isotropic, or omnidirectional, in orientation so that the entire temporary vertical spacer 42 is removed from under the conductive layer 28, 29, and 30. In a second preferred embodiment, the sacrificial layer 42 is removed using a dry, ozone etch. The ozone etch, or plasma strip, removes the sacrificial layer 42 while not attacking, or etching, the conductive layer 28, 29, and 30 or the passivation layer 24. Referring again to FIG. 2, the first preferred embodiment 110 is then completed by the placement of solder bumps 36. The solder bumps 36 adhere to the metal wetting layer 32 during a thermal reflow operation as is well known in the art.

Figure 10:
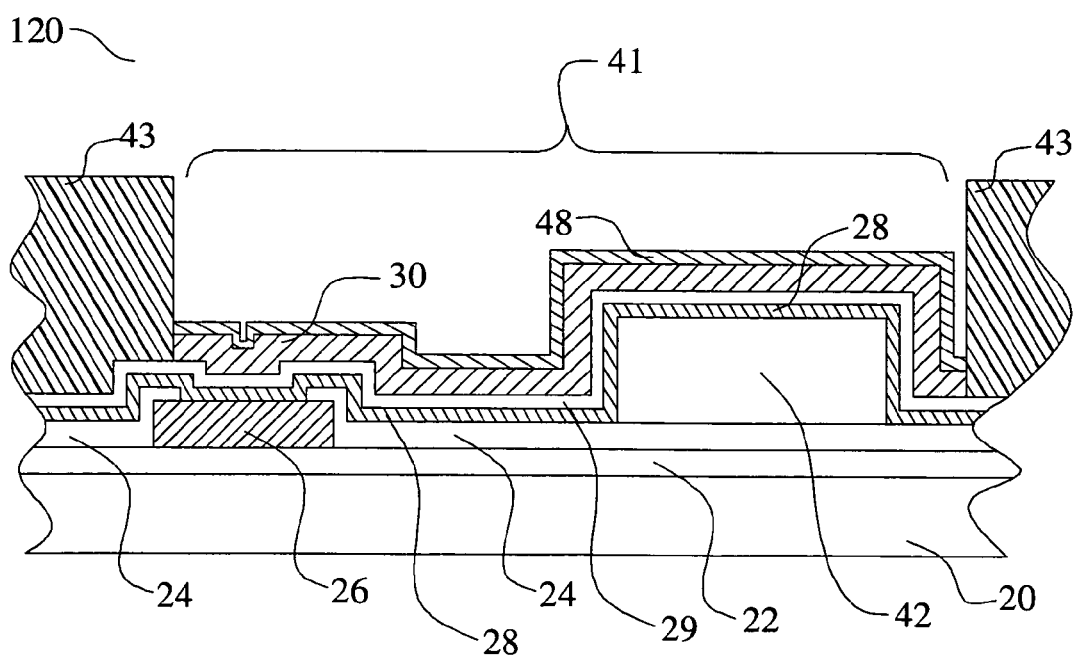
FIGS. 10 through 13 illustrate steps unique to the second preferred embodiment of the present invention.

Referring now to FIG. 10, the first unique step in the method of the second preferred embodiment 120 is shown. The first masking layer 43 is retained for an additional step of processing. A metal wetting layer 48 is formed overlying the metal layer 30 as defined by the opening 41. Again, the metal wetting layer 48 is used to provide an interface region between the metal layer 30, which comprises, for example, Cu, Au, or Ni, and the subsequently formed solder bump, which comprises a lead-based or non-lead based solder as is known in the art. The metal wetting layer 48 improves the adhesion of the solder bump while reducing the resistance at the interface between the solder bump and the metal layer 30. The metal wetting layer 48 preferably comprises Au, Cu, Sn, Ag, Pb or alloys of Au, Cu, Sn, Ag, or Pb. The metal wetting layer 32 is preferably deposited using an electroless plating or electroplating process.

Figure 11:
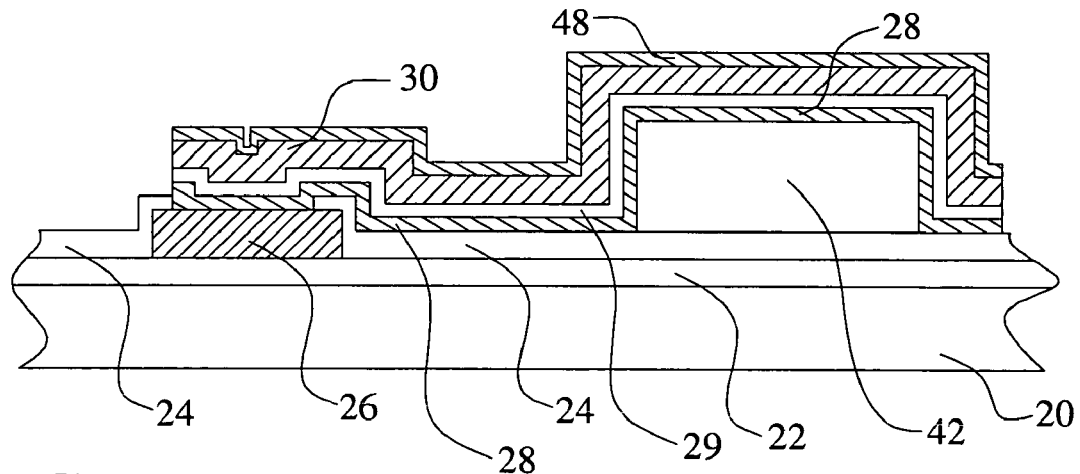

Referring now to FIG. 11, the first masking layer 43 is now removed. Next, the barrier and seed layers 28 and 29 are etched through to complete the patterning of the conductive layer 28, 29, and 30. The metal wetting layer 48 and the metal layer 30 are used as the masking layer for the etching through of the barrier and seed layers 28 and 29. The barrier and seed layers 28 and 29 may be etched using dry or wet chemical methods as is well known in the art.

Figure 12:
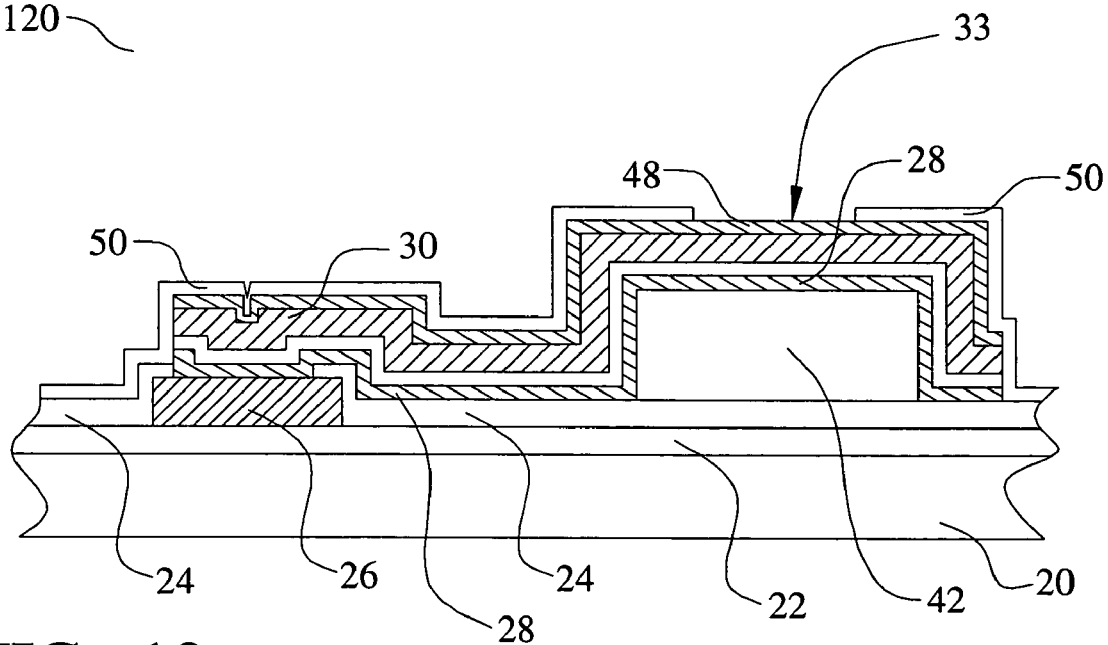

Referring now to FIG. 12, another important feature is illustrated. A post passivation dielectric layer 50 is formed overlying the passivation layer 24, the conductive layer 28, 29, and 30, and the metal wetting layer 48. The post passivation dielectric layer 50 provides an additional isolating layer of between the conductive layer 28, 29, and 30 and the subsequently placed solder bump. The post passivation dielectric layer 50, also called an over coat layer, preferably comprises a polymer material such as polyimide or BCB. This polymer material may be photosensitive or non-photosensitive. The post passivation dielectric layer 50 is preferably deposited by a spin-coating process or by screen printing. The post passivation dielectric layer 50 is patterned to reveal the top surface of the metal wetting layer 48 at the conductive bonding locations 33. The exposed metal wetting layer 48 defines the adhesion width of the placed solder bumps 36 after reflow. The post passivation dielectric layer 50 may be patterned in one of several ways. If screen printing is used, then the post passivation dielectric layer 50 is both deposited and patterned at the same screen printing step. If the post passivation dielectric layer 50 comprises a photosensitive material, then this material is patterned using a photolithographic sequence as described above. If the post passivation dielectric layer 50 is non-photosensitive, then this material is patterned using another photoresist layer, not shown, with a photolithography and etch sequence as described above.

Figure 13:
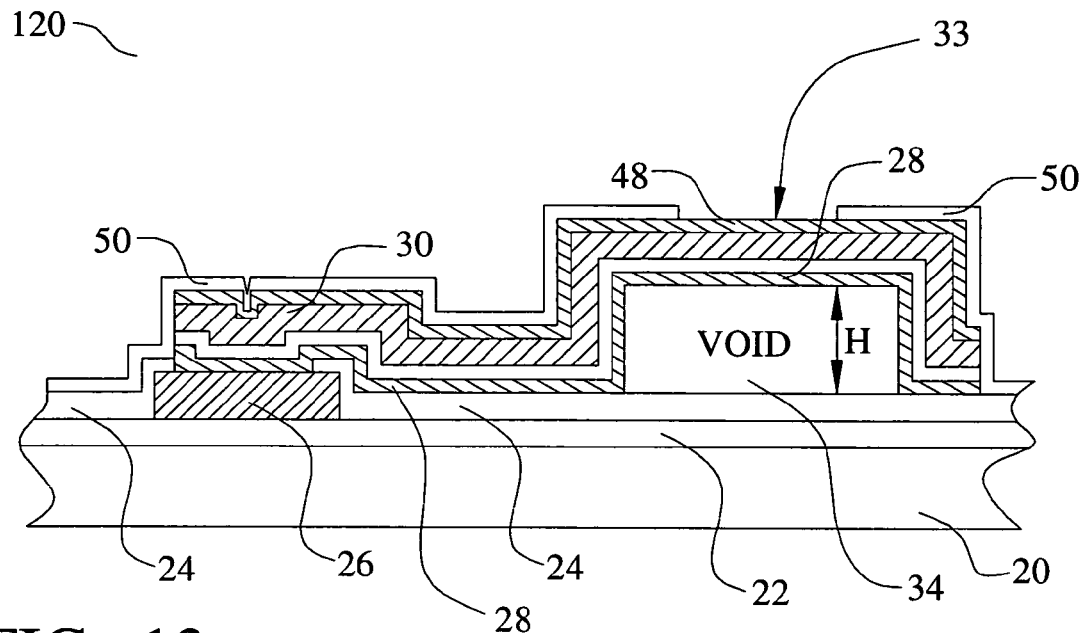

Referring now to FIG. 13, as an important step in the method, the temporary vertical spacers 42 are removed to create voids 34 underlying the conductive layer 28, 29, and 30. The temporary vertical spacers 42 are removed using an isotropic etching method that is selective to the sacrificial layer 42. As a result, the conductive layer 28, 29, and 30 and metal wetting layer 48 become a bridge overlying the passivation layer 24 with a void or gap therebetween. The void has a height H that is defined by the original thickness of the sacrificial layer 42 that is now displaced. In one preferred embodiment, the sacrificial layer 42 is etched away using a wet chemical etch. The wet etch removes the sacrificial layer 42 while leaving the conductive layer 28, 29, and 30, the metal wetting layer 48, and the passivation layer 24. To achieve this, the wet etch must exhibit a slow etching rate for the passivation layer 24, preferably nitride, and the conductive layer 28, 29, and 30, preferably metals, and a rapid etching rate for the sacrificial layer 42, typically a photoresist or a polymer. Further, the etch must be isotropic, or omnidirectional, in orientation so that the entire temporary vertical spacer 42 is removed from under the conductive layer 28, 29, and 30 and metal wetting layer 48. In a second preferred embodiment, the sacrificial layer 42 is removed using a dry, ozone etch. The ozone etch, or plasma strip, removes the sacrificial layer 42 while not attacking, or etching, the conductive layer 28, 29, and 30 or the passivation layer 24. Referring again to FIG. 3, the second preferred embodiment 120 is then completed by the placement of solder bumps 36. The solder bumps 36 adhere to the exposed metal wetting layer 48 during a thermal reflow operation as is well known in the art.

The advantages of the present invention may now be summarized. Methods for fabricating multi-layer wiring structures on a semiconductor chip are achieved. The ability to reduce or eliminate the thermally induced mechanical stresses on the solder ball terminals is achieved. The product fabricated by the methods provides reduction of the thermal stresses and allows a chip scale package to be directly mounted to a printed circuit interconnect. The methods of fabrication utilize materials and fabrication processes currently used in semiconductor manufacture. The product fabricated with the described methods with the thermal compliant multi-layered wiring structure can be used in high thermal cycled products with resultant high reliability.

As shown in the preferred embodiments, the novel methods and device structures of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a circuitry component comprising:
   providing a silicon substrate and a passivation layer over said silicon substrate;
   forming a sacrificial layer over said passivation layer;
   depositing a first metal layer comprising a first portion over said sacrificial layer and a second portion over said passivation layer but not over said sacrificial layer;
   forming a first pattern-defining layer over said first metal layer, a first opening in said first pattern-defining layer exposing said first and second portions;
   depositing a second metal layer over said first and second portions exposed by said first opening;
   removing said first pattern-defining layer;
   removing said first metal layer not under said second metal layer; and
   removing said sacrificial layer.

2. The method of claim 1, wherein said depositing said second metal layer comprises electroplating.

3. The method of claim 1, wherein said sacrificial layer is patterned underlying a location where a bump is to be formed.

4. The method of claim 1, wherein said sacrificial layer comprises polymer.

5. The method of claim 1 further comprising depositing a bump over said second metal layer over a void formed by said removing said sacrificial layer.

6. The method of claim 1 further comprising placing a solder ball over said second metal layer over a void formed by said removing said sacrificial layer.

7. The method of claim 1, wherein said forming said sacrificial layer comprises spin-coating.

8. The method of claim 1, wherein said forming said sacrificial layer comprises laminating.

9. The method of claim 1, wherein said forming said sacrificial layer comprises printing.

10. The method of claim 1, further comprising:
    forming a second pattern-defining layer over said second metal layer, a second opening in said second pattern-defining layer exposing said second metal layer;
    depositing a third metal layer over said second metal layer exposed by said second opening; and
    removing said second pattern-defining layer.

11. The method of claim 10, wherein said depositing said third metal layer comprises depositing gold over said second metal layer exposed by said second opening.

12. The method of claim 10, wherein said depositing said third metal layer comprises depositing tin over said second metal layer exposed by said second opening.

13. The method of claim 10, wherein said depositing said third metal layer comprises electroplating.

14. The method of claim 1, wherein said depositing said second metal layer further comprises depositing copper over said first and second portions exposed by said first opening.

15. The method of claim 1, wherein said depositing said second metal layer further comprises depositing gold over said first and second portions exposed by said first opening.

16. A method for fabricating a circuitry component comprising:
    providing a silicon substrate and a passivation layer over said silicon substrate;
    forming an insulating layer over said passivation layer;
    depositing a first metal layer over said insulating layer;
    forming a first pattern-defining layer over said first metal layer, a first opening in said first pattern-defining layer exposing said first metal layer;
    depositing a second metal layer over said first metal layer exposed by said first opening;
    removing said first pattern-defining layer;
    removing said first metal layer not under said second metal layer; and
    after said depositing said first metal layer, removing said insulating layer.

17. The method of claim 16, wherein said depositing said second metal layer comprises electroplating.

18. The method of claim 16, wherein said insulating layer is patterned underlying a location where a bump is to be formed.

19. The method of claim 16, wherein said insulating layer comprises polymer.

20. The method of claim 16 further comprising depositing a bump over said second metal layer over a void formed by said removing said insulating layer.

21. The method of claim 16 further comprising placing a solder ball over said second metal layer over a void formed by said removing said insulating layer.

22. The method of claim 16, wherein said forming said insulating layer comprises spin-coating.

23. The method of claim 16, wherein said forming said insulating layer comprises printing.

24. The method of claim 16, further comprising:
    forming a second pattern-defining layer over said second metal layer, a second opening in said second pattern-defining layer exposing said second metal layer;

depositing a third metal layer over said second metal layer exposed by said second opening; and removing said second pattern-defining layer.

25. The method of claim 24, wherein said depositing said third metal layer comprises depositing gold over said second metal layer exposed by said second opening.

26. The method of claim 24, wherein said depositing said third metal layer comprises depositing tin over said second metal layer exposed by said second opening.

27. The method of claim 24, wherein said depositing said third metal layer comprises electroplating.

28. The method of claim 16, wherein said depositing said second metal layer further comprises depositing copper over said first metal layer exposed by said first opening.

29. The method of claim 16, wherein said depositing said second metal layer further comprises depositing gold over said first metal layer exposed by said first opening.

30. A method for fabricating a circuitry component comprising:

providing a silicon substrate and a passivation layer over said silicon substrate;

forming an insulating layer over said passivation layer;

electroplating a metal layer over said insulating layer; and after said electroplating said metal layer, removing said insulating layer.

31. The method of claim 30, wherein said insulating layer is patterned underlying a location where a bump is to be formed.

32. The method of claim 30, wherein said insulating layer comprises polymer.

33. The method of claim 30 further comprising depositing a bump over said metal layer over a void formed by said removing said insulating layer under said metal layer.

34. The method of claim 30 further comprising placing a solder ball over said metal layer over a void formed by said removing said insulating layer under said metal layer.

35. The method of claim 30, wherein said forming said insulating layer comprises spin-coating.

36. The method of claim 30, wherein said forming said insulating layer comprises laminating.

37. The method of claim 30, wherein said forming said insulating layer comprises printing.

38. The method of claim 30, wherein said metal layer comprises gold.

39. The method of claim 30, wherein said metal layer comprises copper.

40. The method of claim 30, wherein said metal layer comprises nickel.

41. The method of claim 1, wherein said depositing said second metal layer further comprises depositing nickel over said first and second portions exposed by said first opening.

42. The method of claim 16, wherein said depositing said second metal layer further comprises depositing nickel over said first metal layer exposed by said first opening.

* * * * *